(12) United States Patent
Terai et al.

(10) Patent No.: US 7,236,755 B2
(45) Date of Patent: Jun. 26, 2007

(54) BROADCAST WAVE RECEIVING APPARATUS

(75) Inventors: Kimito Terai, Yokohama (JP); Mikio Mori, Yokohama (JP); Masahiro Kawazoe, Fujisawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 309 days.

(21) Appl. No.: 10/814,744

(22) Filed: Mar. 31, 2004

(65) Prior Publication Data

US 2004/0198283 A1    Oct. 7, 2004

(30) Foreign Application Priority Data

Apr. 2, 2003  (JP)  ............................. 2003-098953

(51) Int. Cl.
*H04B 1/18* (2006.01)
(52) U.S. Cl. .............................. 455/150.1; 455/182.1; 455/161.3; 455/154.1
(58) Field of Classification Search ............ 455/184.1, 455/186.1, 187.1, 183.2, 191.1, 192.1, 164.1, 455/182.3, 182.1, 182.2, 161.3, 160.1, 150.1, 455/154.1
See application file for complete search history.

(56) References Cited

U.S. PATENT DOCUMENTS 4,361,906 A * 11/1982 Sakamoto ................. 455/184.1
4,654,884 A * 3/1987 Sakai et al. ............... 455/187.1
4,868,892 A * 9/1989 Tults et al. ............... 455/183.2
4,919,640 A * 4/1990 Yanagibori ............... 455/164.1
5,303,400 A * 4/1994 Mogi ....................... 455/186.1
5,575,001 A * 11/1996 Ku ........................... 455/192.1
5,809,407 A * 9/1998 Kasperkovitz et al. ... 455/184.1
2005/0221773 A1* 10/2005 Leenaerts et al. ........ 455/150.1

FOREIGN PATENT DOCUMENTS

EP    0 333 194    9/1989
EP    0 910 167    4/1999

* cited by examiner

*Primary Examiner*—Lana Le
(74) *Attorney, Agent, or Firm*—Pearne & Gordon LLP (57) ABSTRACT

Herein disclosed is a broadcast wave receiving apparatus, comprising: first and second tuning circuits each having a resonance frequency; first controlling means for controlling one of the first and second tuning circuits to ensure that the resonance frequency of one of the first and second tuning circuits is tuned to a specific frequency before allowing one of the first and second tuning circuits to detect a broadcast wave at the specific frequency; judging means for judging whether or not to receive the broadcast wave detected by one of the first and second tuning circuits on the basis of predetermined threshold information on the broadcast waves; and second controlling means for controlling the other of the first and second tuning circuits to ensure that the resonance frequency of the other of the first and second tuning circuits is tuned to the specific frequency before allowing the other of the first and second tuning circuits to produce a broadcast signal indicative of the broadcast wave detected by one of the first and second tuning circuits in response to the judgment of the judging means.

6 Claims, 5 Drawing Sheets

BROADCAST WAVE RECEIVING APPARATUS

BACKGROUND OF THE INVENTION

1. Field of the Invention

The present invention relates to a broadcast wave receiving apparatus, and more particularly to a broadcast wave receiving apparatus for selectively receiving a plurality of broadcast waves while performing the detection of the broadcast waves.

2. Description of the Related Art

Up until now, there have been proposed a wide variety of broadcast wave receiving apparatus of this type one typical example of which is disclosed in Japanese Patent Laying-Open Publication No. H08-18405.

Figure 4:
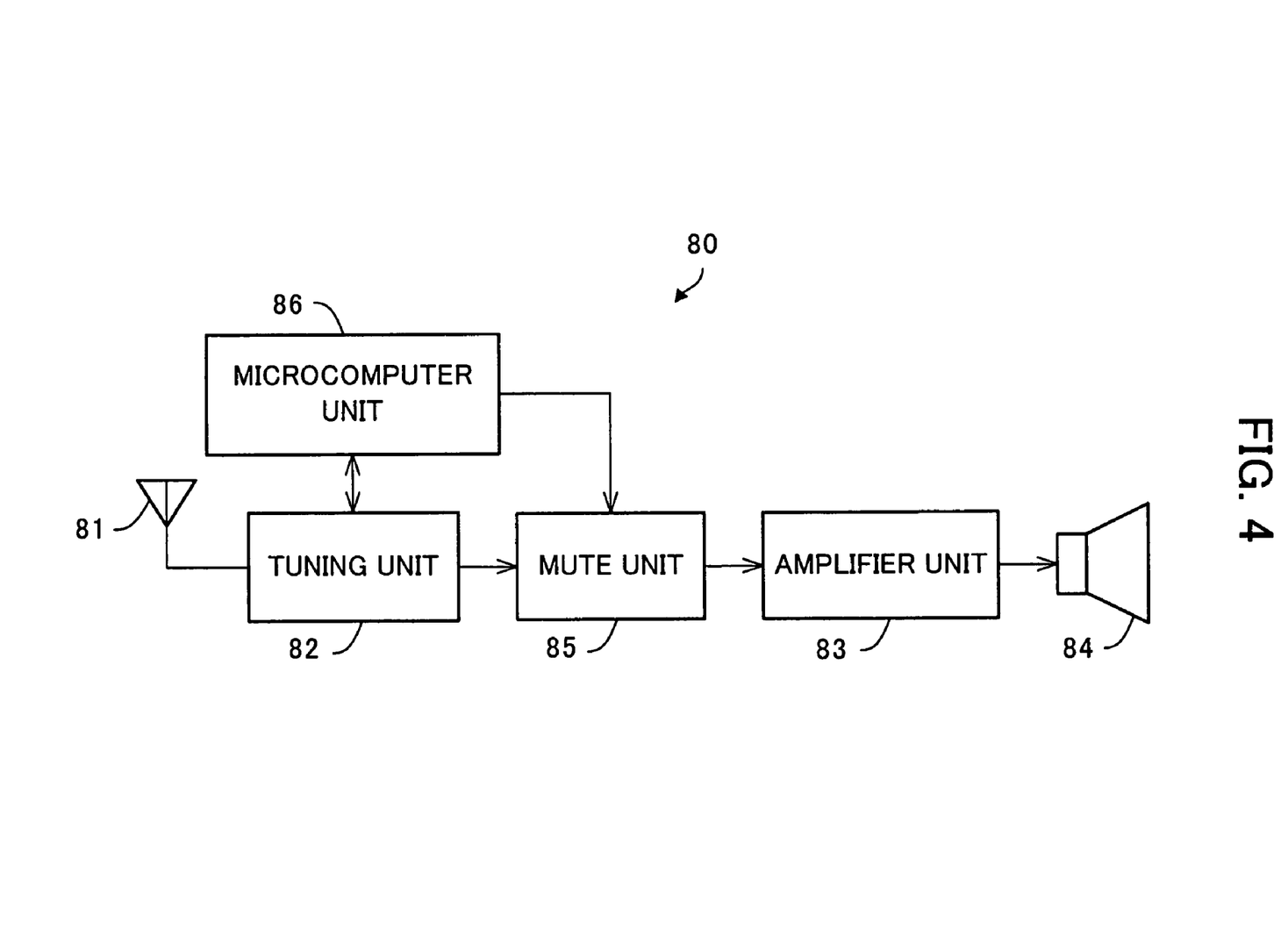
FIG. 4 is a block diagram of the conventional broadcast wave receiving apparatus.

The conventional broadcast wave receiving apparatus 80 comprises an antenna 81 having passed therethrough a plurality of broadcast waves each having information on an audio wave. The broadcast waves are respectively oscillated at specific frequencies different from one another.

The conventional broadcast wave receiving apparatus 80 further comprises a tuning circuit 82 having a resonance frequency electronically tunable to each of the specific frequencies, and a microcomputer unit 86 for controlling the tuning circuit 82 to ensure that the resonance frequency of the tuning circuit 82 is tuned to the specific frequency before allowing the tuning circuit 82 to produce a broadcast signal indicative of the broadcast wave at the specific frequency.

The conventional broadcast wave receiving apparatus 80 further comprises a demodulating unit 87, a mute circuit 85, an amplifier unit 83, and a speaker unit 84. The demodulating unit 87 is adapted to produce an audio signal indicative of the audio wave from the broadcast signal produced by the tuning circuit 82. The mute circuit 85 is adapted to assume two different operation state consisting of a first operation state to have the amplifier unit 16 receive the audio signal from the tuning circuit 82, and a second operation state to have the amplifier unit 16 fail to receive the audio signal from the tuning circuit 82. The amplifier unit 83 is adapted to amplify the audio signal produced by the tuning circuit 82, while the speaker unit 84 is adapted to produce an audio sound to be represented by the audio signal produced by the tuning circuit 82.

Figure 5:
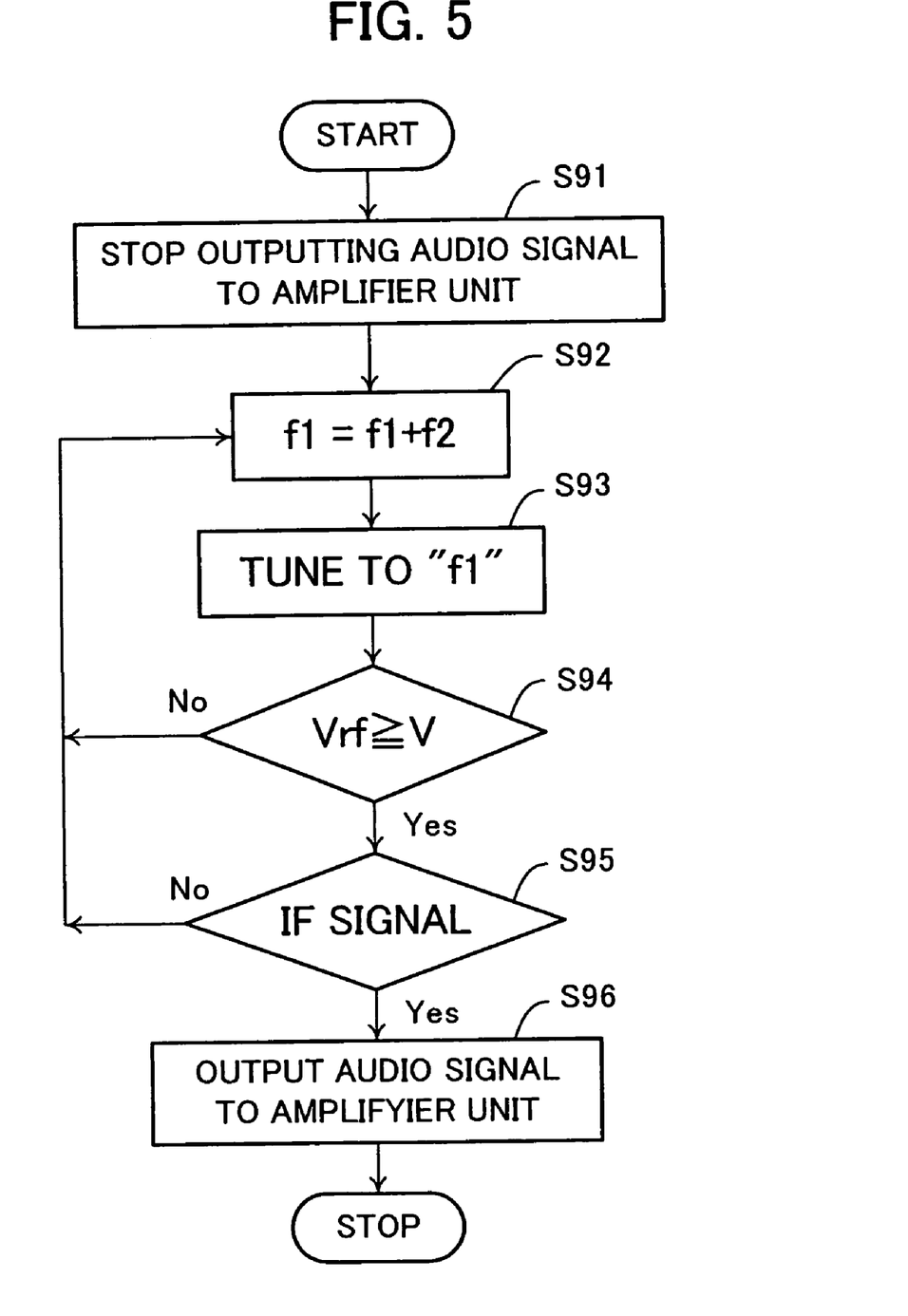
FIG. 5 is a flowchart showing an operation of the conventional broadcast wave receiving apparatus.

When the microcomputer unit 86 is operated to control the tuning circuit 82 to ensure that the resonance frequency of the tuning circuit 82 is electronically and automatically tuned to each of the specific frequencies under the condition that the audio signal is produced from the broadcast wave detected at the specific frequency "f1" by the tuning circuit 82, the audio signal produced by the tuning circuit 82 firstly fails to be outputted to the amplifier unit 83 by the mute circuit 85 in the step S91.

The microcomputer unit 86 is then operated to produce information on the updated specific frequency equal to the addition of the specific frequency "f1" and the increment "f2" in the step S92. The microcomputer unit 86 is then operated to control the tuning circuit 82 to ensure that the resonance frequency of the tuning circuit 82 is tuned to the updated specific frequency "f1" before allowing the tuning circuit 82 to detect the broadcast wave which is oscillated at the updated specific frequency "f1" in the step S93.

The microcomputer unit 86 is then operated to judge whether or not the electric field intensity "Vf" of the broadcast wave detected by the tuning circuit 82 is smaller than the predetermined threshold level "V" in the step S94.

When the answer in the step S94 is affirmative "YES", i.e., the electric field intensity "Vf" of the broadcast wave detected by the tuning circuit 82 is smaller than the predetermined threshold level "V", the step S94 proceeds to the step S92. When, on the other hand, the answer in the step S94 is negative "NO", i.e., the electric field intensity "Vf" of the broadcast wave detected by the tuning circuit 82 is not smaller than the predetermined threshold level "V", the judgment is made by the microcomputer unit 86 whether or not the intermediate signal which is oscillated at the intermediate frequency exists in the broadcast signal indicative of the broadcast wave detected by the tuning circuit 82 in the step S95.

When the answer in the step S95 is affirmative "YES", i.e., the intermediate signal which is oscillated at the intermediate frequency exists in the broadcast signal, the audio signal produced from the broadcast wave is outputted to the amplifier unit 83 by the mute circuit 85. When, on the other hand, the answer in the step S95 is negative "NO", i.e., the intermediate signal which is oscillated at the intermediate frequency does not exist in the broadcast signal, the step S95 proceeds to the step S92.

The conventional broadcast wave receiving apparatus, however, encounters such a problem that the audio sound fails to be produced from the broadcast wave while the detection of the broadcast waves is performed by the microcomputer unit.

SUMMARY OF THE INVENTION

It is an object of the present invention to provide a broadcast wave receiving apparatus which can produce the audio sound from the broadcast wave while performing the detection of the broadcast waves.

According to the one aspect of the present invention, there is provided a broadcast wave receiving apparatus, comprising: first and second tuning circuits each having a resonance frequency; first controlling means for controlling one of the first and second tuning circuits to ensure that the resonance frequency of one of the first and second tuning circuits is tuned to a specific frequency before allowing one of the first and second tuning circuits to detect a broadcast wave at the specific frequency; judging means for judging whether or not to receive the broadcast wave detected by one of the first and second tuning circuits on the basis of predetermined threshold information on the broadcast waves; and second controlling means for controlling the other of the first and second tuning circuits to ensure that the resonance frequency of the other of the first and second tuning circuits is tuned to the specific frequency before allowing the other of the first and second tuning circuits to produce a broadcast signal indicative of the broadcast wave detected by one of the first and second tuning circuits in response to the judgment of the judging means.

The first and second tuning circuits each may include electric field intensity detecting means for detecting the electric field intensity of the broadcast wave at the specific frequency. The broadcast wave receiving apparatus may further comprise electric field intensity judging means for judging whether or not the electric field intensity of the broadcast wave detected at the specific frequency by the electric field intensity detecting means of one of the first and second tuning circuits is smaller than a predetermined threshold level. The second controlling means may be adapted to control the other of the first and second tuning circuits to ensure that the resonance frequency of the other of the first and second tuning circuits is tuned to the specific frequency before allowing the other of the first and second tuning circuits to produce a broadcast signal indicative of the broadcast wave detected by one of the first and second tuning circuits under the condition that the judgment is made that the electric field intensity of the broadcast wave which is oscillated at the specific frequency is larger than the predetermined threshold level.

The first and second tuning circuits each may include multi-path detecting means for detecting a multi-path noise at the specific frequency. The broadcast wave receiving apparatus may further comprise multi-path judging means for judging whether or not the multi-path noise detected at the specific frequency by the multi-path detecting means of one of the first and second tuning circuits is smaller than a predetermined threshold level. The second controlling means may be adapted to control the other of the first and second tuning circuits to ensure that the resonance frequency of the other of the first and second tuning circuits is tuned to the specific frequency before allowing the other of the first and second tuning circuits to produce a broadcast signal indicative of the broadcast wave detected by one of the first and second tuning circuits under the condition that the judgment is made that the multi-path noise detected at the specific frequency by the multi-path detecting means of one of the first and second tuning circuits is smaller than the predetermined threshold level.

The first and second tuning circuits each may include mutual interference detecting means for detecting mutual interference noise at the specific frequency. The broadcast wave receiving apparatus may further comprise mutual interference judging means for judging whether or not the mutual interference noise detected at the specific frequency by the mutual interference detecting means of one of the first and second tuning circuits is smaller than a predetermined threshold level. The second controlling means may be adapted to control the other of the first and second tuning circuits to ensure that the resonance frequency of the other of the first and second tuning circuits is tuned to the specific frequency before allowing the other of the first and second tuning circuits to produce a broadcast signal indicative of the broadcast wave detected by one of the first and second tuning circuits under the condition that the judgment is made that the mutual interference noise detected at the specific frequency by the mutual interference detecting means of one of the first and second tuning circuits is smaller than the predetermined threshold level.

The broadcast wave receiving apparatus may be installed in an automotive vehicle.

BRIEF DESCRIPTION OF THE DRAWINGS

The features and advantages of a broadcast wave receiving apparatus according to the present invention will be more clearly understood from the following description taken in conjunction with the accompanying drawings in which.

DESCRIPTION OF THE PREFERRED EMBODIMENTS

Figure 1:
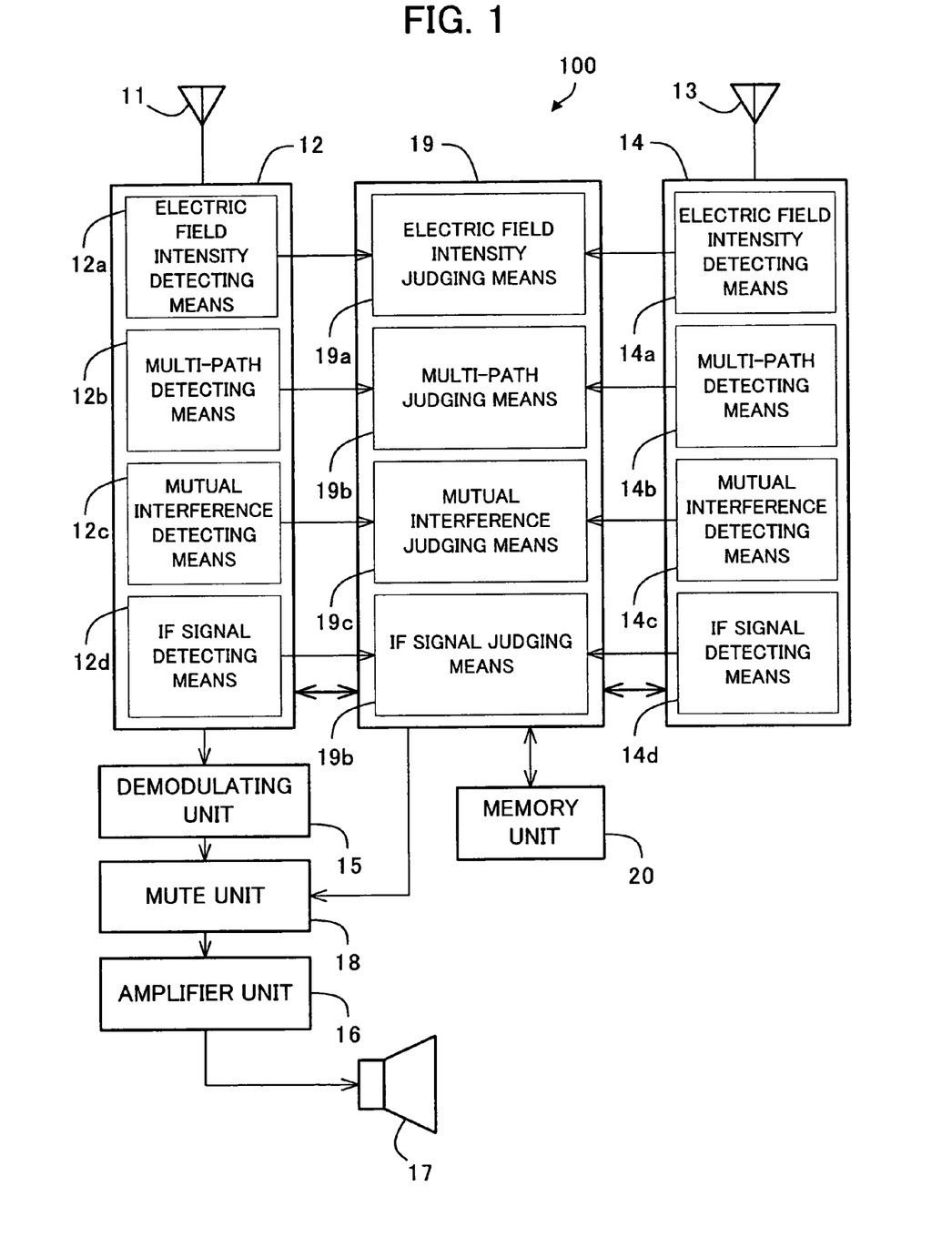
FIG. 1 is a block diagram of the broadcast wave receiving apparatus according to the preferred embodiment of the present invention.
Figure 2:
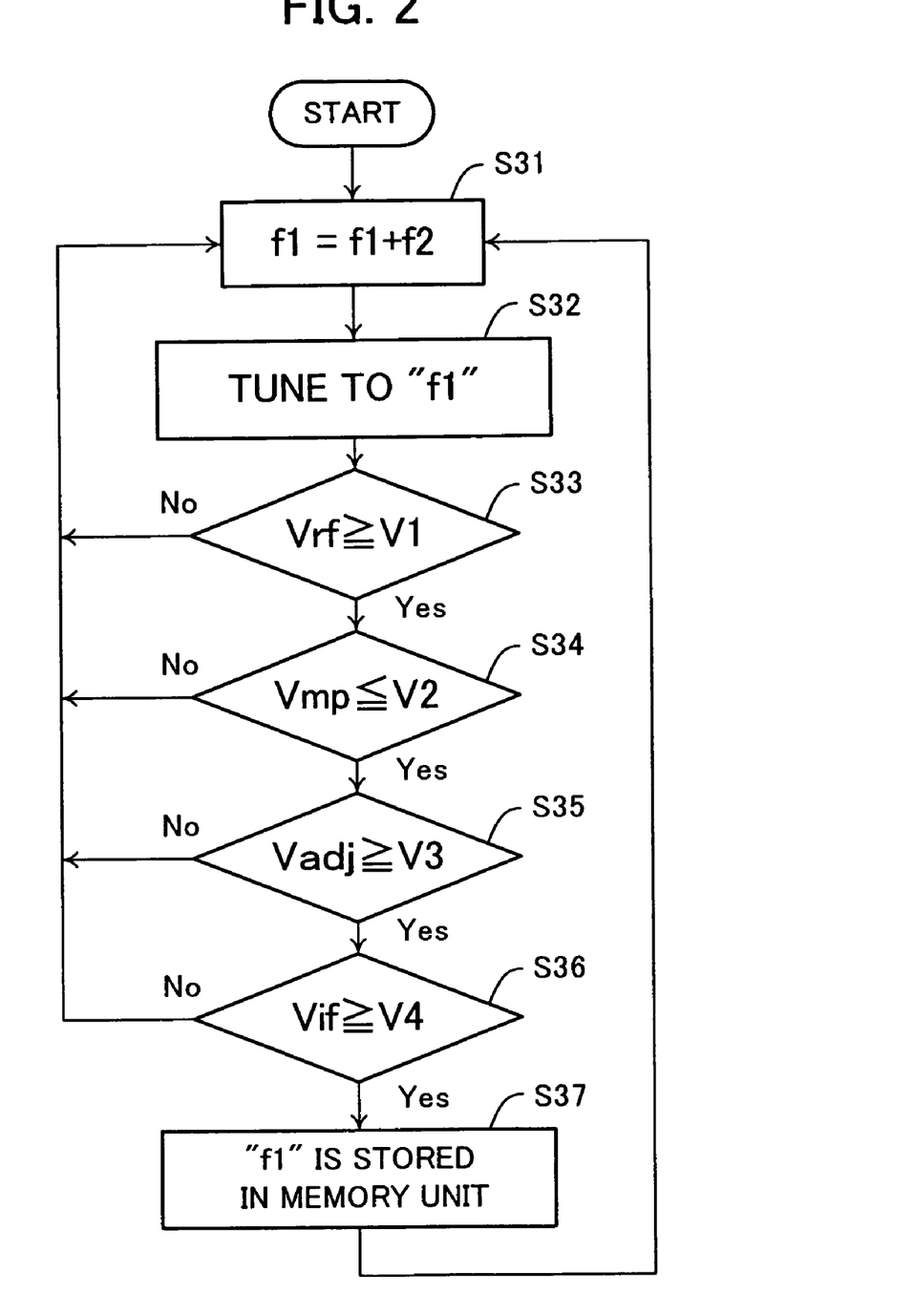
FIG. 2 is a flowchart showing an operation of one of the first and second tuning circuits each forming part of the broadcast wave receiving apparatus according to the preferred embodiment of the present invention.
Figure 3:
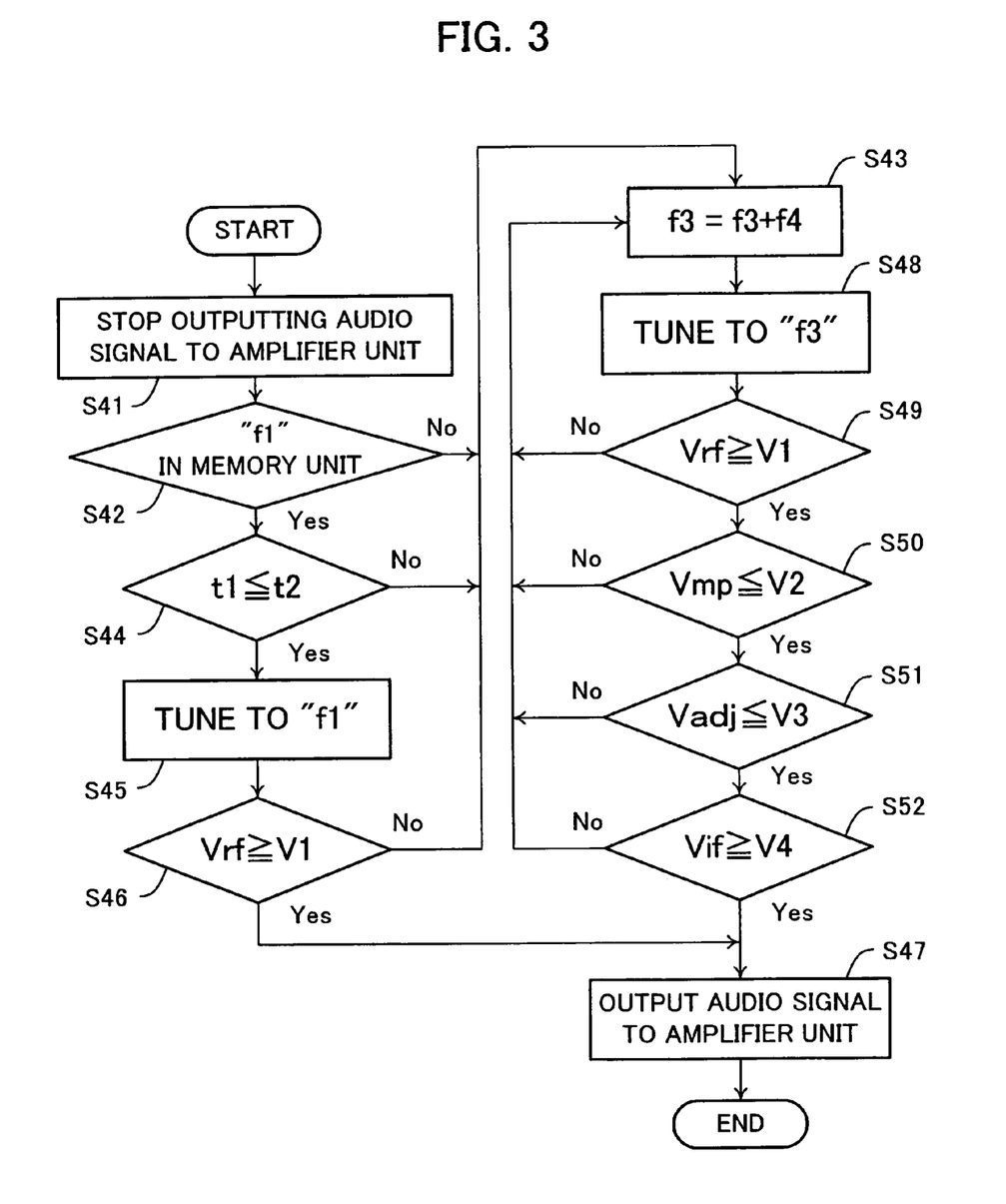
FIG. 3 is a flowchart showing an operation of the other of the first and second tuning circuits each forming part of the broadcast wave receiving apparatus according to the preferred embodiment of the present invention.

Referring now to FIGS. 1 to 3 of the drawings, there is shown one preferred embodiment of the broadcast wave receiving apparatus according to the present invention.

The following description will now be directed to the constitution of the broadcast wave receiving apparatus according to the preferred embodiment of the present invention.

The broadcast wave receiving apparatus 10 is shown in FIG. 1 as comprising first and second antennas 11 and 13 each having passed therethrough a plurality of broadcast waves each having an electric field intensity. The broadcast waves are respectively oscillated at specific frequencies.

The broadcast wave receiving apparatus 10 further comprises first and second tuning circuits 12 and 14 each having a resonance frequency electronically tunable to each of the specific frequencies, first controlling means for controlling one of the first and second tuning circuits 12 and 14 to ensure that the resonance frequency of one of the first and second tuning circuits 12 and 14 is tuned to one of the specific frequencies before allowing one of the first and second tuning circuits 12 and 14 to detect a broadcast wave at one of the specific frequencies, judging means for judging whether or not to receive the broadcast wave detected by one of the first and second tuning circuits 12 and 14 on the basis of predetermined threshold information on the broadcast waves, and second controlling means for controlling the other of the first and second tuning circuits 12 and 14 to ensure that the resonance frequency of the other of the first and second tuning circuits 12 and 14 is tuned to the specific frequency before allowing the other of the first and second tuning circuits 12 and 14 to produce a broadcast signal indicative of the broadcast wave detected by one of the first and second tuning circuits 12 and 14 in response to the judgment of the judging means.

The first tuning circuit 12 includes electric field intensity detecting means 12*a* for detecting the electric field intensity of the broadcast wave at the specific frequency, while the second tuning circuit 14 includes electric field intensity detecting means 14*a* for detecting the electric field intensity of the broadcast wave at the specific frequency.

The broadcast wave receiving apparatus 100 further comprises electric field intensity judging means 19*a* for judging whether or not the electric field intensity of the broadcast wave detected at the specific frequency by the electric field intensity detecting means 12*a*, 14*a* of one of the first and second tuning circuits 12 and 14 is smaller than a predetermined threshold level.

The second controlling means is adapted to control the other of the first and second tuning circuits 12 and 14 to ensure that the resonance frequency of the other of the first and second tuning circuits 12 and 14 is tuned to the specific frequency before allowing the other of the first and second tuning circuits 12 and 14 to produce a broadcast signal indicative of the broadcast wave detected by one of the first and second tuning circuits 12 and 14 under the condition that the judgment is made that the electric field intensity of the broadcast wave which is oscillated at the specific frequency is larger than the predetermined threshold level.

The first tuning circuit 12 includes multi-path detecting means 12b for detecting a multi-path noise at the specific frequency, while the second tuning circuit 14 includes multi-path detecting means 14b for detecting a multi-path noise at the specific frequency.

The broadcast wave receiving apparatus 100 further comprises multi-path judging means 19b for judging whether or not the multi-path noise detected at the specific frequency by the multi-path detecting means 12b, 14b of one of the first and second tuning circuits 12 and 14 is smaller than a predetermined threshold level.

The second controlling means is adapted to control the other of the first and second tuning circuits 12 and 14 to ensure that the resonance frequency of the other of the first and second tuning circuits 12 and 14 is tuned to the specific frequency before allowing the other of the first and second tuning circuits 12 and 14 to produce a broadcast signal indicative of the broadcast wave detected by one of the first and second tuning circuits 12 and 14 under the condition that the judgment is made that the multi-path noise detected at the specific frequency by the multi-path detecting means 12b, 14b of one of the first and second tuning circuits 12 and 14 is smaller than the predetermined threshold level.

The first tuning circuit 12 includes mutual interference detecting means 12c for detecting mutual interference noise at the specific frequency, while the second tuning circuit 14 includes mutual interference detecting means 14c for detecting mutual interference noise at the specific frequency.

The broadcast wave receiving apparatus 100 further comprises mutual interference judging means 19c for judging whether or not the mutual interference noise detected at the specific frequency by the mutual interference detecting means 12c, 14c of one of the first and second tuning circuits 12 and 14 is smaller than a predetermined threshold level.

The second controlling means is adapted to control the other of the first and second tuning circuits 12 and 14 to ensure that the resonance frequency of the other of the first and second tuning circuits 12 and 14 is tuned to the specific frequency before allowing the other of the first and second tuning circuits 12 and 14 to produce a broadcast signal indicative of the broadcast wave detected by one of the first and second tuning circuits 12 and 14 under the condition that the judgment is made that the mutual interference noise detected at the specific frequency by the mutual interference detecting means 12c, 14c of one of the first and second tuning circuits 12 and 14 is smaller than the predetermined threshold level.

The first tuning circuit 12 includes intermediate frequency signal detecting means 12d and 14d for detecting an intermediate frequency signal, while the second tuning circuit 14 includes intermediate frequency signal detecting means 14b for detecting an intermediate frequency signal.

The broadcast wave receiving apparatus 100 further comprises intermediate frequency signal judging means 19d for judging whether or not the level of the intermediate frequency signal detected by the intermediate frequency signal detecting means 12d, 14d of one of the first and second tuning circuits 12 and 14 is smaller than a predetermined threshold level.

The first and second controlling means (not shown), the electric field intensity judging means 19a, the multi-path judging means 19b, and the mutual interference judging means 19c collectively constitute a microcomputer unit 19.

The broadcast wave receiving apparatus 100 may be installed in an automotive vehicle.

The memory unit 20 may have stored therein frequency information on the frequency of the broadcast wave detected by one of the first and second tuning units 12 and 14, and time information on the time at which the detection of the broadcast waves is performed by the microcomputer unit 19.

The following description will be directed to the operation of the broadcast wave receiving apparatus according to the preferred embodiment of the present invention.

The operation of the second tuning circuit forming part of the broadcast wave receiving apparatus according to the preferred embodiment of the present invention will now be described hereinafter with reference to FIG. 2.

The microcomputer unit 19 is firstly operated to control the second tuning circuit 14 to ensure that the resonance frequency of the second tuning circuit 14 is tuned to the specific frequency equal to the addition of the specific frequency "f1" and the incremental value "f2" in the step S31, and to allow the second tuning circuit 14 to produce a broadcast signal indicative of the broadcast wave which is oscillated at the frequency "f1" in the step S32.

The judgment is made by the electric field intensity judging means 19a of the microcomputer unit 19 on whether or not the electric field intensity "Vrf" of the broadcast wave detected at the frequency "f1" by the electric field intensity detecting means 14a of the second tuning circuit 14 is smaller than the predetermined threshold level "V1" in the step S33.

When the answer in the step S33 is affirmative "YES", i.e., the electric field intensity "Vrf" of the broadcast wave detected at the frequency "f1" by the electric field intensity detecting means 14a of the second tuning circuit 14 is smaller than the predetermined threshold level "V1", the step S33 proceeds to the step S31.

When, on the other hand, the answer in the step S33 is negative "NO", i.e., the electric field intensity "Vrf" of the broadcast wave detected at the frequency "f1" by the electric field intensity detecting means 14a of the second tuning circuit 14 is not smaller than the predetermined threshold level "V1", the judgment is made by the multi-path judging means 19b of the microcomputer unit 19 on whether or not the multi-path noise "Vmp" detected at the frequency "f1" by the multi-path detecting means 14b of the second tuning circuit 14 is larger than the predetermined threshold level "V2" in the step S34.

When the answer in the step S34 is affirmative "YES", i.e., the multi-path noise "Vmp" detected at the frequency "f1" by the multi-path detecting means 14b of the second tuning circuit 14 is larger than the predetermined threshold level "V2", the step S34 proceeds to the step S31.

When, on the other hand, the answer in the step S34 is negative "NO", i.e., the multi-path noise "Vmp" detected at the frequency "f1" by the multi-path detecting means 14b of the second tuning circuit 14 is larger than the predetermined threshold level "V2", the judgment is made by the mutual interference judging means 19c of the microcomputer unit 19 on whether or not the mutual interference noise "Vadj" detected at the frequency "f1" by the mutual interference detecting means 14c of the second tuning circuit 14 is larger than the predetermined threshold level "V3" in the step S35.

When the answer in the step S35 is affirmative "YES", i.e., the mutual interference noise "Vadj" detected at the frequency "f1" by the mutual interference detecting means 14c of the second tuning circuit 14 is larger than the predetermined threshold level "V3", the step S35 proceeds to the step S31.

When, on the other hand, the answer in the step S34 is negative "NO", i.e., the mutual interference noise "Vadj" detected at the frequency "f1" by the mutual interference detecting means 14c of the second tuning circuit 14 is not larger than the predetermined threshold level "V3", the judgment is made by the IF signal judging means 19d of the microcomputer unit 19 on whether or not the IF signal "Vif" detected at the frequency "f1" by the IF signal detecting means 14d of the second tuning circuit 14 is smaller than the predetermined threshold level "V4" in the step S36.

When the answer in the step S36 is affirmative "YES", i.e., the IF signal "Vif" detected at the frequency "f1" by the IF signal detecting means 14d of the second tuning circuit 14 is smaller than the predetermined threshold level "V4", the step S36 proceeds to the step S31.

When, on the other hand, the answer in the step S36 is negative "NO", i.e., the IF signal "Vif" detected at the frequency "f1" by the IF signal detecting means 14d of the second tuning circuit 14 is not smaller than the predetermined threshold level "V4", the frequency information on the frequency "f1" of the broadcast wave detected by the tuning circuit 14 and the time information on the time at which the detection of the broadcast waves is performed by the microcomputer unit 19 are stored in the memory unit 20. The time difference information on the time difference "t1" between the current time and the time at which the detection of the broadcast waves is performed by the microcomputer unit 19 is then produced by the microcomputer unit 19 in the step S37.

The operation of the first tuning circuit forming part of the broadcast wave receiving apparatus according to the preferred embodiment of the present invention will now be described hereinafter with reference to FIG. 3.

The microcomputer unit 19 is firstly operated to control the first tuning circuit 12 tune to ensure that the resonance frequency of the first tuning circuit 12 is tuned to the frequency "f3" before allowing the first tuning circuit 12 to produce a broadcast signal indicative of the broadcast wave which is oscillated at the frequency "f3". The audio signal indicative of the audio sound is produced from the broadcast signal produced by the first tuning circuit 12 by the demodulating unit 15. The audio signal produced by the demodulating unit 15 is received by the amplifier unit 16 through the mute unit 18, while the audio signal is amplified by the amplifier unit 16. The audio sound is produced from the audio signal amplified by the amplifier unit 16 by the speaker unit 17.

When the microcomputer unit 19 is operated to control the first tuning circuit 12 tune to ensure that the resonance frequency of the first tuning circuit 12 is tuned to the frequency "f1", the mute unit 18 is operated to have the amplifier unit 16 fail to receive the audio signal produced by the demodulating unit 15 in the step S41. The judgment is made by the microcomputer unit 19 on whether or not the memory unit 20 has the frequency information on the frequency "f1" in the step S42.

When the answer in the step S42 is negative "NO", i.e., the memory unit 20 does not have the frequency information on the frequency "f1" of the broadcast wave, the microcomputer unit 19 is operated to control the first tuning circuit 12 to ensure that the resonance frequency of the first tuning circuit 12 is tuned to the updated frequency "f3" equal to the addition of the frequency "f3" and the incremental value "f4" in the step S43 before allowing the first tuning circuit 12 to produce a broadcast signal indicative of the broadcast wave which is oscillated at the updated frequency "f3" in the step S43.

When, on the other hand, the answer in the step S42 is affirmative "YES", i.e., the memory unit 20 have the frequency information on the frequency "f1" of the broadcast wave, the judgment is made by the microcomputer unit 19 on whether or not the time difference between the current time and the time at which the detection of the broadcast waves is performed by the microcomputer unit 19 exceeds the predetermined threshold level "t2" in the step S44.

When the answer in the step S44 is affirmative "YES", i.e., the time difference between the current time and the time at which the detection of the broadcast waves is performed by the microcomputer unit 19 exceeds the predetermined threshold level "t2", the step 44 proceeds to the step S43.

When, on the other hand, the answer in the step S44 is negative "NO", i.e., the time difference between the current time and the time at which the detection of the broadcast waves is performed by the microcomputer unit 19 does not exceed the predetermined threshold level "t2", the microcomputer unit 19 is operated to control the first tuning circuit 12 to ensure that the resonance frequency of the first tuning circuit 12 is tuned to the frequency "f1" to be represented by the frequency information stored by the memory unit 20 before allowing the first tuning circuit 12 to produce a broadcast signal indicative of the broadcast wave which is oscillated at the frequency "f1" in the step S45.

The judgment is made by the electric field intensity judging means 19a of the microcomputer unit 19 on whether or not the electric field intensity "Vrf" of the broadcast wave detected at the frequency "f1" by the electric field intensity detecting means 12a of the first tuning circuit 12 is smaller than the predetermined threshold level "V1" in the step S46.

When the answer in the step S46 is affirmative "YES", i.e., the electric field intensity "Vrf" of the broadcast wave detected at the frequency "f1" by the electric field intensity detecting means 12a of the first tuning circuit 12 is smaller than the predetermined threshold level "V1", the microcomputer unit 19 is operated to control the first tuning circuit 12 to ensure that the resonance frequency of the first tuning circuit 12 is tuned to the updated frequency "f3" equal to the addition of the frequency "f3" and the incremental value "f4" before allowing the first tuning circuit 12 to produce a broadcast signal indicative of the broadcast wave which is oscillated at the updated frequency "f3" in the step S48.

When, on the other hand, the answer in the step S46 is negative "NO", i.e., the electric field intensity "Vrf" of the broadcast wave detected at the frequency "f1" by the electric field intensity detecting means 12a of the first tuning circuit 12 is not smaller than the predetermined threshold level "V1", the mute unit 18 is operated to have the amplifier unit 16 receive the audio signal produced by the demodulating unit 15. The audio signal produced by the demodulating unit 15 is then amplified by amplifier unit 16. The audio sound is then produced from the audio signal amplified by the amplifier unit 16 by the speaker unit 17 in the step S47.

When the microcomputer unit 19 is operated to control the first tuning circuit 12 to ensure that the resonance frequency of the first tuning circuit 12 is tuned to the updated frequency "f3" equal to the addition of the frequency "f3" and the incremental value "f4" before allowing the first tuning circuit 12 to produce a broadcast signal indicative of the broadcast wave which is oscillated at the updated frequency "f3" in the step S43, the judgment is made by the electric field intensity judging means 19a of the microcomputer unit 19 on whether or not the electric field intensity "Vrf" of the broadcast wave detected at the updated frequency "f3" by the electric field intensity detecting means 12a of the first tuning circuit 12 is smaller than the predetermined threshold level "V1" in the step S49.

When the answer in the step S49 is affirmative "YES", i.e., the electric field intensity "Vrf" of the broadcast wave detected at the updated frequency "f3" by the electric field intensity detecting means 12a of the first tuning circuit 12 is smaller than the predetermined threshold level "V1", the step S49 proceeds to the step S43.

When, on the other hand, the answer in the step S49 is negative "NO", i.e., the electric field intensity "Vrf" of the broadcast wave detected at the updated frequency "f3" by the electric field intensity detecting means 12a of the first tuning circuit 12 is not smaller than the predetermined threshold level "V1", the judgment is made by the multi-path judging means 19b of the microcomputer unit 19 on whether or not the multi-path noise "Vmp" detected at the updated frequency "f3" by the multi-path detecting means 12b of the first tuning circuit 12 is larger than the predetermined threshold level "V2" in the step S50.

When the answer in the step S50 is affirmative "YES", i.e., the multi-path noise "Vmp" detected at the updated frequency "f3" by the multi-path detecting means 12b of the first tuning circuit 12 is larger than the predetermined threshold level "V2", the step S50 proceeds to the step S43.

When, on the other hand, the answer in the step S50 is negative "NO", i.e., the multi-path noise "Vmp" detected at the updated frequency "f3" by the multi-path detecting means 12b of the first tuning circuit 12 is not larger than the predetermined threshold level "V2", the judgment is made by the mutual interference judging means 19c of the microcomputer unit 19 on whether or not the mutual interference noise "Vadj" detected at the updated frequency "f3" by the mutual interference detecting means 12c of the first tuning circuit 12 is larger than the predetermined threshold level "V3" in the step S51.

When the answer in the step S51 is affirmative "YES", i.e., the mutual interference noise "Vadj" detected at the updated frequency "f3" by the mutual interference detecting means 12c of the first tuning circuit 12 is larger than the predetermined threshold level "V3", the step S51 proceeds to the step S43.

When, on the other hand, the answer in the step S51 is negative "NO", i.e., the mutual interference noise "Vadj" detected at the updated frequency "f3" by the mutual interference detecting means 12c of the first tuning circuit 12 is not larger than the predetermined threshold level "V3", the judgment is made by the IF signal judging means 19d of the microcomputer unit 19 on whether or not the IF signal "Vif" detected at the updated frequency "f3" by the IF signal detecting means 14d of the first tuning circuit 12 is smaller than the predetermined threshold level "V4" in the step S52.

When the answer in the step S52 is affirmative "YES", i.e., the IF signal "Vif" detected at the updated frequency "f3" by the IF signal detecting means 12d of the first tuning circuit 12 is smaller than the predetermined threshold level "V4", the step S52 proceeds to the step S43.

When, on the other hand, the answer in the step S52 is negative "NO", i.e., the IF signal "Vif" detected at the frequency "f1" by the IF signal detecting means 12d of the first tuning circuit 12 is not smaller than the predetermined threshold level "V4", the mute unit 18 is operated to have the amplifier unit 16 receive the audio signal produced by the demodulating unit 15. The audio signal produced by the demodulating unit 15 is then amplified by amplifier unit 16. The audio sound is then produced from the audio signal amplified by the amplifier unit 16 by the speaker unit 17 in the step S47.

From the above detail description, it will be understood that the broadcast wave receiving apparatus can produce a broadcast signal indicative of the broadcast wave while performing the detection of the broadcast waves The broadcast wave receiving apparatus according to the present invention can allow the frequency information on the frequency of the broadcast wave having an electric field intensity larger or equal to the predetermined threshold level "V1" to be stored into the memory unit, and prevent the frequency information on the frequency of the broadcast wave having an electric field intensity smaller than the predetermined threshold level "V1" from being stored into the memory unit.

The broadcast wave receiving apparatus according to the present invention can allow the frequency information on the frequency "f1" of the broadcast wave to be stored into the memory unit when the judgment is made that the multi-path noise detected at the frequency "f1" is smaller than the predetermined threshold level "V2", and prevent the frequency information on the frequency "f1" of the broadcast wave from being stored into the memory unit when, on the other hand, the judgment is made that the multi-path noise detected at the frequency "f1" is not smaller than the predetermined threshold level "V2".

The broadcast wave receiving apparatus according to the present invention can allow the frequency information on the frequency "f1" of the broadcast wave to be stored into the memory unit when the judgment is made that the mutual interference noise detected at the frequency "f1" is smaller than the predetermined threshold level "V3", and prevent the frequency information on the frequency "f1" of the broadcast wave from being stored into the memory unit when, on the other hand, the judgment is made that the mutual interference noise detected at the frequency "f1" is not smaller than the predetermined threshold level "V3".

The broadcast wave receiving apparatus according to the present invention can update the frequency information stored in the memory unit when the time difference "t1" between the current time and the time at which the detection of the broadcast waves is performed by the microcomputer unit is larger than the predetermined threshold level "t2".

The broadcast wave receiving apparatus according to the present invention may regularly update the frequency information stored in the memory unit.

The broadcast wave receiving apparatus according to the present invention can selectively receive the broadcast waves which are respectively oscillated at the specific frequencies each to be represented by the frequency information stored in the memory unit.

While there has been described in the foregoing embodiment about the fact that the broadcast wave receiving apparatus according to the present invention is installed into the in-vehicle audio system, the broadcast wave receiving apparatus according to the present invention may be installed into other electronic appliance such as for example a portable audio system and a mobile phone.

While there has been described in the foregoing embodiment about the fact that the broadcast wave receiving apparatus according to the present invention can allow the frequency information on the frequency of the broadcast wave having an electric field intensity larger or equal to the predetermined threshold level "V1" to be stored into the memory unit, and prevent the frequency information on the frequency of the broadcast wave having an electric field intensity smaller than the predetermined threshold level "V1" from being stored into the memory unit, the memory unit of the broadcast wave receiving apparatus according to the present invention may have stored therein, irrespective of the level of the electric field intensity of the broadcast wave, the frequency information on the frequency of the detected broadcast wave.

The broadcast wave receiving apparatus according to the present invention may selectively receive, irrespective of the level of the electric field intensity of the broadcast wave, the broadcast waves which are respectively oscillated at the specific frequencies each to be represented by the frequency information stored in the memory unit.

While there has been described in the foregoing embodiment about the fact that the broadcast wave receiving apparatus according to the present invention can allow the frequency information on the frequency "f1" of the broadcast wave to be stored into the memory unit when the judgment is made that the multi-path noise detected at the frequency "f1" is smaller than the predetermined threshold level "V2", and prevent the frequency information on the frequency "f1" of the broadcast wave from being stored into the memory unit when, on the other hand, the judgment is made that the multi-path noise detected at the frequency "f1" is not smaller than the predetermined threshold level "V2", the memory unit of the broadcast wave receiving apparatus according to the present invention may have stored therein, irrespective of the level of the multi-path noise detected by the multi-path detecting means of each of the first and second tuning units, the frequency information on the frequency of the detected broadcast wave.

The broadcast wave receiving apparatus according to the present invention may selectively receive, irrespective of the level of the multi-path noise detected by the multi-path detecting means of each of the first and second tuning units, the broadcast waves which are respectively oscillated at the specific frequencies each to be represented by the frequency information stored in the memory unit.

While there has been described in the foregoing embodiment about the fact that the broadcast wave receiving apparatus according to the present invention can allow the frequency information on the frequency "f1" of the broadcast wave to be stored into the memory unit when the judgment is made that the mutual interference noise detected at the frequency "f1" is smaller than the predetermined threshold level "V3", and prevent the frequency information on the frequency "f1" of the broadcast wave from being stored into the memory unit when, on the other hand, the judgment is made that the mutual interference noise detected at the frequency "f1" is not smaller than the predetermined threshold level "V3", the memory unit of the broadcast wave receiving apparatus according to the present invention may have stored therein, irrespective of the level of the mutual interference noise detected by the mutual interference detecting means of each of the first and second tuning units, the frequency information on the frequency of the detected broadcast wave.

The broadcast wave receiving apparatus according to the present invention may selectively receive, irrespective of the level of the mutual interference noise detected by the mutual interference detecting means of each of the first and second tuning units, the broadcast waves which are respectively oscillated at the specific frequencies each to be represented by the frequency information stored in the memory unit.

While the subject invention has been described with relation to the preferred embodiment, various modifications and adaptations thereof will now be apparent to those skilled in the art as far as such modifications and adaptations fall in the scope of the appended claims intended to be covered thereby.

What is claimed is:

1. A broadcast wave receiving apparatus, comprising:
   first and second tuning circuits each having a resonance frequency;
   first controlling means for controlling one of said first and second tuning circuits to ensure that said resonance frequency of one of said first and second tuning circuits is tuned to a specific frequency before allowing one of said first and second tuning circuits to detect a broadcast wave at said specific frequency;
   judging means for judging whether or not to receive said broadcast wave detected by one of said first and second tuning circuits on the basis of predetermined threshold information on said broadcast waves; and
   second controlling means for controlling the other of said first and second tuning circuits to ensure that said resonance frequency of the other of said first and second tuning circuits is tuned to said specific frequency before allowing the other of said first and second tuning circuits to produce a broadcast signal indicative of said broadcast wave detected by one of said first and second tuning circuits in response to the judgment of said judging means, wherein said first and second tuning circuits each includes electric field intensity detecting means for detecting said electric field intensity of said broadcast wave at said specific frequency, which further comprises electric field intensity judging means for judging whether or not said electric field intensity of said broadcast wave detected at said specific frequency by said electric field intensity detecting means of one of said first and second tuning circuits is smaller than a predetermined threshold level, and in which said second controlling means is adapted to control the other of said first and second tuning circuits to ensure that said resonance frequency of the other of said first and second tuning circuits is tuned to said specific frequency before allowing the other of said first and second tuning circuits to produce a broadcast signal indicative of said broadcast wave detected by one of said first and second tuning circuits under the condition that the judgment is made that said electric field intensity of said broadcast wave which is oscillated at said specific frequency is larger than said predetermined threshold level.

2. A broadcast wave receiving apparatus as set forth in claim 1, which is installed in an automotive vehicle.

3. A broadcast wave receiving apparatus, comprising:
   first and second tuning circuits each having a resonance frequency;
   first controlling means for controlling one of said first and second tuning circuits to ensure that said resonance frequency of one of said first and second tuning circuits is tuned to a specific frequency before allowing one of said first and second tuning circuits to detect a broadcast wave at said specific frequency;
   judging means for judging whether or not to receive said broadcast wave detected by one of said first and second tuning circuits on the basis of predetermined threshold information on said broadcast waves; and
   second controlling means for controlling the other of said first and second tuning circuits to ensure that said resonance frequency of the other of said first and second tuning circuits is tuned to said specific frequency before allowing the other of said first and second tuning circuits to produce a broadcast signal indicative of said broadcast wave detected by one of said first and second tuning circuits in response to the judgment of said judging means, wherein said first and second tuning circuits each includes multi-path detecting means for detecting a multi-path noise at said specific frequency, which further comprises multi-path judging means for judging whether or not said multi-path noise detected at said specific frequency by said multi-path detecting means of one of said first and second tuning circuits is smaller than a predetermined threshold level, and in which said second controlling means is adapted to control the other of said first and second tuning circuits to ensure that said resonance frequency of the other of said first and second tuning circuits is tuned to said specific frequency before allowing the other of said first and second tuning circuits to produce a broadcast signal indicative of said broadcast wave detected by one of said first and second tuning circuits under the condition that the judgment is made that said multi-path noise detected at said specific frequency by said multi-path detecting means of one of said first and second tuning circuits is smaller than said predetermined threshold level.

4. A broadcast wave receiving apparatus as set forth in claim 3, which is installed in an automotive vehicle.

5. A broadcast wave receiving apparatus, comprising:
first and second tuning circuits each having a resonance frequency;
first controlling means for controlling one of said first and second tuning circuits to ensure that said resonance frequency of one of said first and second tuning circuits is tuned to a specific frequency before allowing one of said first and second tuning circuits to detect a broadcast wave at said specific frequency;
judging means for judging whether or not to receive said broadcast wave detected by one of said first and second tuning circuits on the basis of predetermined threshold information on said broadcast waves; and
second controlling means for controlling the other of said first and second tuning circuits to ensure that said resonance frequency of the other of said first and second tuning circuits is tuned to said specific frequency before allowing the other of said first and second tuning circuits to produce a broadcast signal indicative of said broadcast wave detected by one of said first and second tuning circuits in response to the judgment of said judging means, wherein said first and second tuning circuits each includes mutual interference detecting means for detecting mutual interference noise at said specific frequency, which further comprises mutual interference judging means for judging whether or not said mutual interference noise detected at said specific frequency by said mutual interference detecting means of one of said first and second tuning circuits is smaller than a predetermined threshold level, and in which said second controlling means is adapted to control the other of said first and second tuning circuits to ensure that said resonance frequency of the other of said first and second tuning circuits is tuned to said specific frequency before allowing the other of said first and second tuning circuits to produce a broadcast signal indicative of said broadcast wave detected by one of said first and second tuning circuits under the condition that the judgment is made that said mutual interference noise detected at said specific frequency by said mutual interference detecting means of one of said first and second tuning circuits is smaller than said predetermined threshold level.

6. A broadcast wave receiving apparatus as set forth in claim 5, which is installed in an automotive vehicle.

* * * * *